United States Patent
Deck et al.

(10) Patent No.: US 12,244,115 B2
(45) Date of Patent: Mar. 4, 2025

(54) LASER DEVICE WITH SAFETY INTERLOCK AND SCIENTIFIC INSTRUMENT FOR USE WITH THE SAME

(71) Applicant: FEI COMPANY, Hillsboro, OR (US)

(72) Inventors: Francis Deck, Hillsboro, OR (US); Justin Morrow, Hillsboro, OR (US)

(73) Assignee: FEI COMPANY, Hillsboro, OR (US)

( * ) Notice: Subject to any disclaimer, the term of this patent is extended or adjusted under 35 U.S.C. 154(b) by 171 days.

(21) Appl. No.: 18/083,228

(22) Filed: Dec. 16, 2022

(65) Prior Publication Data
US 2024/0204470 A1    Jun. 20, 2024

(51) Int. Cl.
*G01J 3/44* (2006.01)
*G01J 3/02* (2006.01)
*H01S 3/00* (2006.01)

(52) U.S. Cl.
CPC .......... *H01S 3/0014* (2013.01); *G01J 3/0205* (2013.01); *G01J 3/0218* (2013.01); *G01J 3/027* (2013.01); *G01J 3/44* (2013.01); *H01S 3/005* (2013.01)

(58) Field of Classification Search
CPC . G01J 3/44; G01J 3/027; G01J 3/0205; H01S 3/0014; H01S 5/06825; B23K 26/127
See application file for complete search history.

(56) References Cited

U.S. PATENT DOCUMENTS

| | | | | |
|---|---|---|---|---|
| 4,907,169 A | * | 3/1990 | Lovoi | B23K 26/21 348/90 |
| 10,195,085 B2 | | 2/2019 | Campos et al. | |
| 2003/0053048 A1 | | 3/2003 | Bennett et al. | |
| 2014/0269794 A1 | | 9/2014 | Murray et al. | |
| 2016/0216369 A1 | | 7/2016 | Kumarakrishnan et al. | |
| 2019/0017922 A1 | | 1/2019 | Bush et al. | |

FOREIGN PATENT DOCUMENTS

| | | | | | |
|---|---|---|---|---|---|
| CN | 1177100 A | * | 3/1998 | ........... | G01N 21/718 |
| CN | 114226360 A | | 3/2022 | | |
| EP | 4064322 A1 | * | 9/2022 | ........... | B23K 10/003 |
| JP | 60137593 A | * | 7/1985 | ............ | B23K 26/14 |
| JP | H05212575 A | * | 8/1993 | ............ | B23K 26/12 |
| JP | 2011228543 A | | 11/2011 | | |
| WO | 2023170385 A1 | | 9/2023 | | |

OTHER PUBLICATIONS

InstruTech, "CVM211 Stinger (TM) Convection", Product Overview, 2021, <https://www.instrutechinc.com/products/convection-pirani-capacitance-gauges/cvm211-stinger-convection/>, 2 pages.
European Patent Office. Extended European Search Report for Application 23215018.5, dated Apr. 15, 2024 (8 pages).

* cited by examiner

*Primary Examiner* — Maurice C Smith
(74) *Attorney, Agent, or Firm* — Michael Best & Friedrich LLP

(57) ABSTRACT

A laser device for use with a scientific instrument. The laser device includes a laser emitter and a control system. The laser emitter is configured to generate a laser beam for radiating a sample disposed in a vacuum chamber of the scientific instrument. The control system is configured to receive a pressure signal associated with the vacuum chamber from a pressure sensor, and to change a state of the laser beam in response to the pressure reaching a threshold level.

18 Claims, 4 Drawing Sheets

LASER DEVICE WITH SAFETY INTERLOCK AND SCIENTIFIC INSTRUMENT FOR USE WITH THE SAME

BACKGROUND

The present disclosure relates to a laser device, such as a Raman spectrometer probe, for use with a vacuum chamber, such as the vacuum chamber of a microscope or other scientific instrument.

SUMMARY

In one implementation, the disclosure provides a laser device for use with a scientific instrument. The laser device includes a laser emitter configured to generate a laser beam for radiating a sample disposed in a vacuum chamber of the scientific instrument, and a control system configured to receive a pressure signal associated with the vacuum chamber from a pressure sensor, and to change a state of the laser beam in response to the pressure reaching a threshold level.

In another implementation, the disclosure provides a Raman probe for use with a microscope. The Raman probe includes a laser emitter configured to generate a laser beam for radiating a sample disposed in a sample chamber, a sensor configured to sense a pressure associated with the sample chamber, and a control system configured to: monitor the pressure associated with the sample chamber; and change a state of the laser beam in response to the pressure reaching a threshold level.

In yet another implementation, the disclosure provides a method of providing a safety interlock for a laser device useable with a scientific instrument. The method includes providing a laser emitter configured to generate a laser beam for radiating a sample disposed in a vacuum chamber of the scientific instrument, providing a sensor configured to sense a pressure associated with the vacuum chamber of the scientific instrument, and changing a state of the laser beam in response to the pressure in the vacuum chamber of the scientific instrument reaching a threshold level.

Other aspects of the disclosure will become apparent by consideration of the detailed description and accompanying drawings.

DETAILED DESCRIPTION

Before any implementations of the disclosure are explained in detail, it is to be understood that the disclosure is not limited in its application to the details of construction and the arrangement of components set forth in the following description or illustrated in the following drawings. The disclosure is capable of other implementations and of being practiced or of being carried out in various ways.

Figure 1:
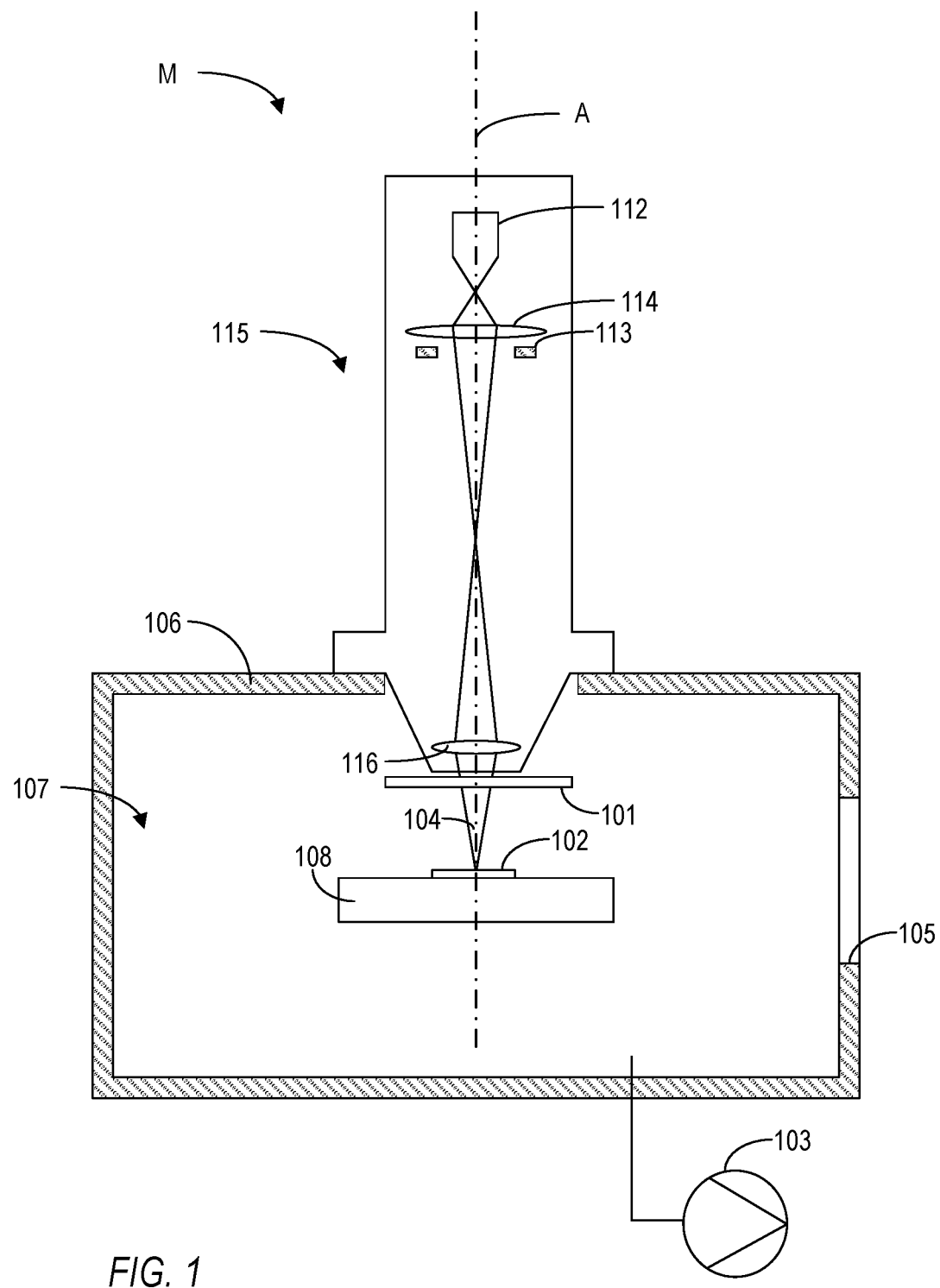
FIG. 1 schematically illustrates a longitudinal cross-sectional elevation view of a scientific instrument having a vacuum enclosure in accordance with an implementation of the present disclosure.

FIG. 1 is a highly schematic depiction of an implementation of a scientific instrument, such as a microscope M, with which a laser device 210 (shown in FIG. 2) can be implemented. The microscope M includes a vacuum enclosure 106 having a vacuum chamber (i.e., a sample chamber) 107 therein for analyzing (which may include inspecting and/or modifying) a sample 102. The microscope M also defines an optical axis A intersecting the vacuum chamber 107 for inspecting (e.g., imaging, collecting data on, etc.) the sample 102. Other types of scientific instruments including a vacuum enclosure (such as the vacuum enclosure 106) defining a vacuum chamber (such as the vacuum chamber 107) for receiving a sample may be employed.

The microscope M may be a charged particle microscope. FIG. 1 shows an implementation of a scanning electron microscope (SEM), though any type of charged particle microscope may be represented by the microscope M shown in FIG. 1, such as a transmission electron microscope, a scanning/transmission electron microscope, an ion-based microscope, a proton-based microscope, etc. In other implementations, any type of microscope having a vacuum chamber (such as the vacuum chamber 107) may be employed. In yet other implementations, any type of scientific instrument having a vacuum chamber (such as the vacuum chamber 107) may be employed.

The microscope M may include a particle-optical column 115 defining the optical axis A. The particle-optical column 115 may be mounted on the vacuum enclosure 106 or any other suitable structure. Within the particle-optical column 115, electrons generated by an electron source 112 are modified by a compound lens system 114 before being focused along the optical axis A onto the sample 102 by a lens system 116. An incident beam 104 may scan over the sample 102 by operating scan coils 113. The sample 102 may be held by a specimen stage 108 disposed in the vacuum enclosure 106. The specimen stage 108 may be insertable into and removable from the vacuum chamber 107 for loading, removing, and changing the sample S.

The microscope M may include one or more detectors for detecting various emissions from the sample 102 in response to the irradiation of incident beam 104. For example, a detector 101 may detect electrons, such as backscattered and/or secondary electrons emitted from the sample 102. In one example, the detector 101 may be a segmented electron detector.

The vacuum enclosure 106 is configured to hold a vacuum suitable for analyzing the sample 102. The vacuum is a pressure in the pressure chamber 107 that is lower than ambient atmospheric pressure. For example, in environmental scanning electron microscope (ESEM) applications, the vacuum may include a pressure of 26 millibars or lower. As another example, in low vacuum applications, the vacuum may include a pressure of 2 millibars or lower. As another example, the vacuum may include a pressure that is $10^{-3}$ millibars or lower. As another example, in high vacuum applications, the vacuum may include a pressure that is $6 \cdot 10^{-6}$ millibars or lower. As another example, the vacuum may include a pressure that is $10^{-7}$ millibars or lower. As another example, the vacuum may include a pressure that is $10^{-8}$ millibars or lower, etc. The vacuum enclosure 106 is fluidly coupled to at least one pump 103 for creating the vacuum.

Figure 2:
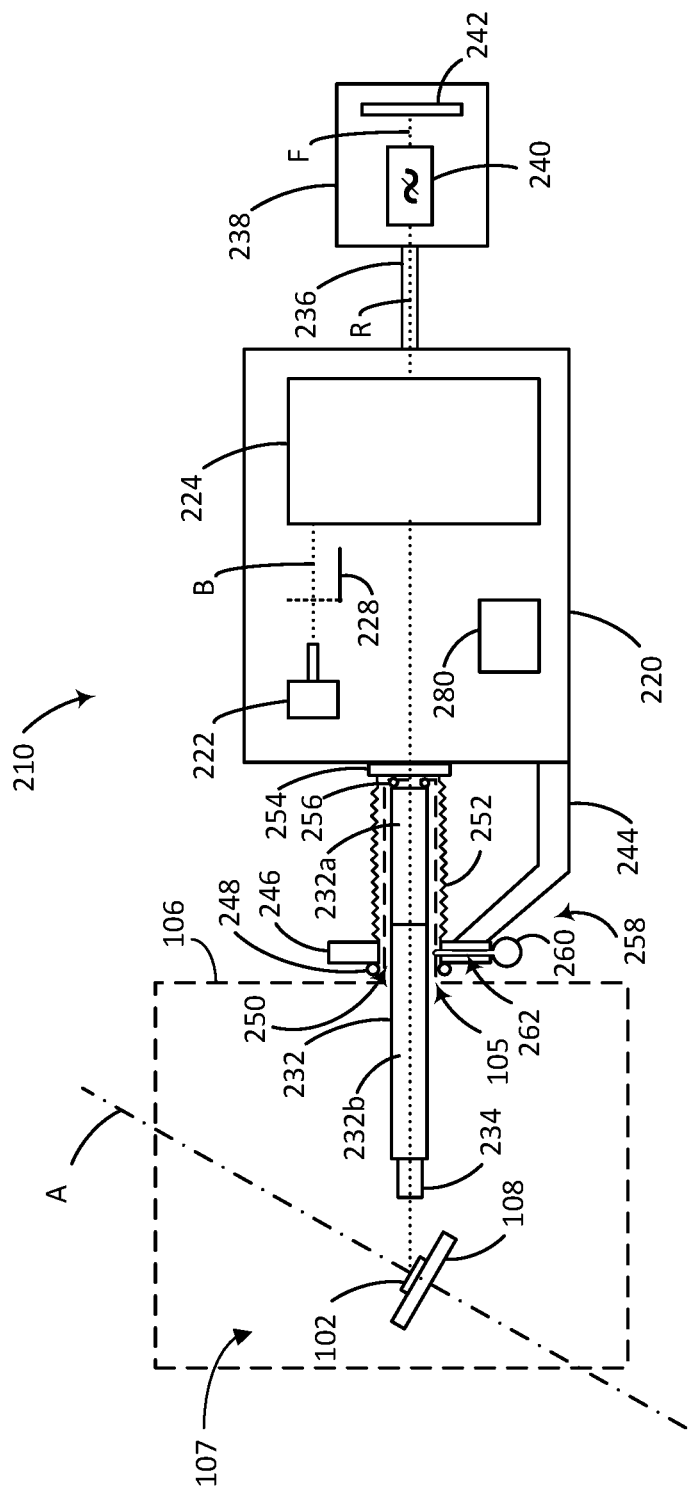
FIG. 2 schematically illustrates a laser device for use with the vacuum enclosure of the scientific instrument shown in FIG. 1.

The vacuum enclosure 106 may include a vacuum port 105 for selectively receiving a probe, such as the laser device 210 shown in FIG. 2. The vacuum port 105 is configured to be openable to receive the laser device 210 and to be closeable when the laser device 210 is removed. In other implementations, the laser device 210 may be integrated with (e.g., non-segregable from, or formed as a part of) the microscope M (or other scientific instrument).

With reference to FIG. 2, the laser device 210 includes a device housing 220 enclosing a laser emitter 222 and an optical assembly 224. The laser emitter 222 is configured to emit a laser beam B. The optical assembly 224 is configured to direct the laser beam B. The laser beam B may have any desired wavelength. For example, the laser beam B may have a wavelength anywhere in the range of 200 nanometers to 50 microns. More specifically, the laser beam B may have a wavelength anywhere from ultraviolet (e.g., 350 nanometers) to infrared (e.g., 1064 nanometers), e.g., for Raman spectroscopy applications.

The optical assembly 224 may include one or more mirrors and/or laser galvanometers configured to control the path of the laser beam B. The optical assembly 224 may also include one or more filters, such as a filter for controlling the power of the laser beam B at the sample 102.

The laser device 210 may include a shutter 228 configured for selectively blocking the laser beam B. For example, the shutter 228 may be movable between an open position (shown as a solid line in FIG. 2) allowing the laser beam B to pass and a closed position (shown as a broken line in FIG. 2) blocking the laser beam B. When the laser beam B is blocked, the laser beam B cannot pass through the shutter 228 and thus cannot exit the laser device 210. In some implementations, the shutter 228 may be movably coupled to the microscope M (or other scientific instrument) and configured to block the laser beam B from exiting the microscope M (or other scientific instrument). Movement of the shutter 228 may be controllable manually or electronically. For example, the shutter 228 may be mounted on a solenoid 230 (FIG. 4), the shutter 228 configured to block the laser beam B when the solenoid 230 is de-energized. In other implementations, the shutter 228 may be configured to block the laser beam B when the solenoid 230 is energized. Other suitable structures for controlling movement of the shutter 228 are possible, such as step motors, etc. The shutter 228 may be disposed anywhere along the path of the laser beam B and may be part of the laser device 210 and/or the microscope M. In some implementations, the shutter 228 may be embodied as a stationary (immovable) opaque portion of any part of the laser device 210 or the microscope M, such as a housing or enclosure thereof, and a mirror(s) and/or galvanometer(s) (e.g., part of the optical assembly 224) may be moved to redirect the laser beam B to the shutter 228.

The laser device 210 may include a relay lens 232 for relaying the laser beam B from the optical assembly 224 to the sample 102 and for receiving and relaying reflected light (e.g., the laser beam light reflected off the sample 102) back into the laser device 210. In the illustrated implementation, the laser device 210 includes a first relay lens 232a and a second relay lens 232b, though any number of relay lenses 232 may be employed. The laser device 210 may include an objective lens 234 coupled at the distal end of the relay lens 232. The objective lens 234 may be aligned with the relay lens 232.

The laser device 210 may be couplable to a spectrograph fiber 236 configured as a flexible optical conduit for transmitting light to a spectrograph 238. In other implementations, other optical conduits may be employed. In one example, the laser device 210 may be a Raman probe configured to radiate the sample 102 with the laser beam B, receive reflected light R off the sample 102, and direct the reflected light R using the spectrograph fiber 236 (or other suitable means) to the spectrograph 238. The laser beam B and the reflected light R may be coaxial. One or both of the laser device 210 or the spectrograph 238 may include one or more filters 240 configured to filter the reflected light R to remove the wavelength of the laser beam B. The remaining spectrum (filtered reflected light F), after filtering out the wavelength of the laser beam B, may be received by a spectrograph detector 242 and analyzed (e.g., examined, compared, explained, and/or interpreted) to determine a material composition of the sample 102. In some implementations, the spectrograph 238 includes the one or more filters 240 and the spectrograph detector 242 for receiving the filtered reflected light F. Thus, the spectrograph 238 may be a separate module connectable and disconnectable from the laser device 210 by way of the spectrograph fiber 236. In other implementations, the spectrograph 238 may be part of the laser device 210. In any implementation, the spectrograph fiber 236 may be considered to be part of the optical assembly 224. In other implementations, the laser device 210 may be embodied as other types of laser devices, such as a fluorescence probe, or any other laser device operable to analyze a sample in a vacuum chamber. As another example, the laser device 210 may be a laser milling machine using the laser beam B at a wavelength configured to mill, machine, etch, ablate, burn, melt, vaporize, cut, etc., or otherwise modify the sample S inside the microscope M.

The laser device 210 includes a support bracket 244 coupled to the device housing 220, and a vacuum flange 246 coupled to the support bracket 244. The vacuum flange 246 is configured to be removably coupled to the vacuum enclosure 106, e.g., by way of any type of suitable fastener (s), clamp, latch, any other suitable means, or any combination thereof (not shown). For example, the vacuum flange 246 and the enclosure 106 may include one or more apertures (not shown) configured to receive one or more corresponding fasteners (not shown) for tightening the vacuum flange 246 against the enclosure 106. As another example, the vacuum flange 246 and the enclosure 106 may be configured to receive a clamp (not shown) around respective rims thereof. For example, a hinged clamp, or any other suitable clamp, may be employed to tighten the vacuum flange 246 to a corresponding flange of the enclosure 106 or of an adapter. In any implementation, one or more seals 248, such as an O-ring, a gasket, etc., may be employed to hold the vacuum between the vacuum enclosure 106 and the laser device 210. The vacuum flange 246 is configured to allow the laser device 210 to be selectively coupled (in a sealed fashion) and uncoupled from the vacuum enclosure 106. The vacuum flange 246 may include an aperture 250 therethrough, and the relay lens 232 may be disposed through the aperture 250. The laser device 210 may include a bellows 252, such as steel bellows or any other suitable material, for holding the vacuum in the vacuum enclosure 106. The bellows 252 may be disposed between the vacuum flange 246 and the device housing 220 and may surround at least a portion of the relay lens 232. The bellows 252 may be coupled to the vacuum flange 246 at one end with a seal configured to hold the vacuum, such as an o-ring seal or other suitable seal (not shown). The bellows 252 may be coupled to the device housing 220 or to a vacuum sealing window 254 at an opposite end with a seal 256 configured to hold the vacuum, such as an o-ring seal or other suitable seal. The vacuum sealing window 254 may be configured as an optical window allowing the laser beam B to pass through and may include a seal (not shown), such as one or more o-ring seals, or any other suitable type of seal(s), for holding the vacuum. In some implementations, the vacuum sealing window 254 is formed by an end of the relay lens 232 held against the seal 256.

A vacuum interlock (or safety interlock) 258 is configured to change a state of the laser beam B in response to the pressure in the vacuum chamber 107 reaching a threshold pressure (or threshold level of pressure). The state of the laser beam B is a condition and/or circumstance of the laser beam B as regards power and/or position. For example, changing the state of the laser beam B may include inhibiting the laser beam B from leaving the laser device 210, inhibiting the laser beam B from leaving the vacuum chamber 107, inhibiting the laser beam B from leaving the microscope M (or other scientific instrument), or, conversely, allowing the laser beam B to leave the laser device 210 (e.g., to enter the vacuum chamber 107). Even more specifically, inhibiting the laser beam B may include turning off the laser emitter 222 and/or blocking the laser beam B (e.g., using the shutter 228, and/or constraining the path of the laser beam B within the device housing, e.g., using mirror(s) and/or galvanometer(s), or any other suitable means), and/or otherwise inhibiting the laser beam B from operating normally at full capacity. Allowing the laser beam B may include turning on the laser emitter 222 and/or unblocking the laser beam B (e.g., using the shutter 228, mirror(s), and/or galvanometer(s), or other suitable means), and/or allowing the laser beam B to operate normally (e.g., to radiate the sample S) using any suitable means, or otherwise returning to the status quo.

"Reaching a threshold (pressure) level" includes being "equal to," "equal to or greater than," or "greater than" the threshold pressure. In one example, the threshold pressure may be preselected or actively set to any desired pressure. For example, the threshold pressure may be higher than the normal operating pressure in the vacuum chamber 107 such that a broken vacuum can be detected. The threshold pressure may be between the normal operating pressure and atmospheric pressure. The normal operating pressure may be a pressure range of the vacuum chamber 107 within which the sample may be analyzed using a charged particle beam. For example, in ESEM applications, the threshold pressure may be more than 26 millibars, e.g., 50 millibars or higher, or 50-100 millibars. In low vacuum applications, the threshold pressure may be more than 2 millibars, e.g., 10 millibars or higher, or 50 millibars or higher, or 50-100 millibars. In high vacuum applications, the threshold pressure may be any pressure that is $6 \cdot 10^{-6}$ millibars or higher, such as $10^{-3}$ millibars or higher, $10^{-2}$ millibars or higher, etc. In some implementations, a second threshold pressure may correspond to a drop in pressure (e.g., the pumping of the vacuum in the vacuum chamber 107) in order to allow the laser device 210 to be operable (e.g., to allow the laser beam B). With respect to the second threshold pressure, "reaching the second threshold (pressure) level" includes being "equal to," "equal to or less than," or "less than" the second threshold pressure.

The vacuum interlock 258 may include a sensor 260 configured to sense the pressure associated with the vacuum chamber 107 when the laser device 210 is attached to, or used with, the microscope M. The sensor 260 may be disposed in any suitable location for reading the pressure in the vacuum chamber 107. In one example, the sensor 260 may be coupled to the vacuum flange 246. The sensor 260 may be configured to read the pressure through an aperture 262 in the vacuum flange 246, as shown in FIG. 2. The sensor 260 may be sealed into the aperture 262 using epoxy, e.g., vacuum-grade epoxy. In other implementations, the sensor 260 may be configured to read the pressure adjacent the vacuum flange 246, or in any other suitable location in communication with the vacuum chamber 107. For example, the sensor 260 may be disposed in the vacuum chamber 107. In such implementations where the sensor 260 is disposed in the vacuum chamber 107, the sensor 260 may be part of the laser device 210 or part of the microscope M. If the sensor 260 is part of the microscope M, the vacuum interlock 258 may be configured to receive an external signal from the sensor 260. As another example, the sensor 260 may be coupled to the relay lens 232 and/or the objective lens 234.

The sensor 260 may be a vacuum sensor or a pressure sensor. Any type of suitable sensor 260 may be employed, such as a mechanical sensor (e.g., a diaphragm snap sensor), a dial gauge, an absolute pressure sensor, a thermal conductivity sensor, a capacitance sensor, a convection sensor, a Piezo sensor, a McLeod gauge, an ionization sensor, etc., or any other sensor or combination thereof.

Figure 3:
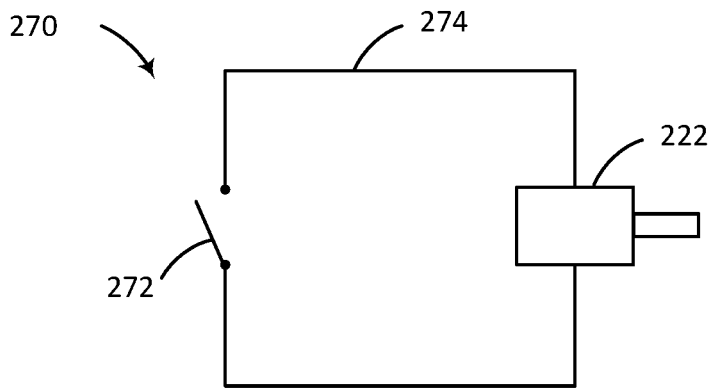
FIG. 3 is schematic diagram of one implementation of a control system of the laser device shown in FIG. 2.

As shown in FIG. 3, the vacuum interlock 258 may include a control system 270 configured to change the state of the laser beam B in response to the pressure reaching the threshold pressure. The control system 270 may be analog, digital, or a combination thereof.

In one implementation, as illustrated in FIG. 3, the control system 270 may include a relay 272 (which may also be referred to interchangeably herein as a switch) configured to open and close in response to the pressure read by the sensor 260. The relay 272 may be configured to allow power to the laser emitter 222 through a relay circuit 274 when closed and turn off the laser emitter 222 when open. The relay 272 may be configured to open in response to the pressure reaching the threshold pressure. The relay 272 may be configured to close in response to the pressure dropping below the threshold pressure, or in response to the pressure dropping below the second threshold pressure that is different from the threshold pressure. (The threshold pressure may also be referred to as a first threshold pressure herein.) Any suitable type of switch or relay may be employed. The relay 272 may be separate from or integrated with the sensor 260. If integrated, the combined relay 272 and sensor 260 may be referred to as a vacuum switch. Other means for turning on and off the laser emitter 222 are possible.

Figure 4:
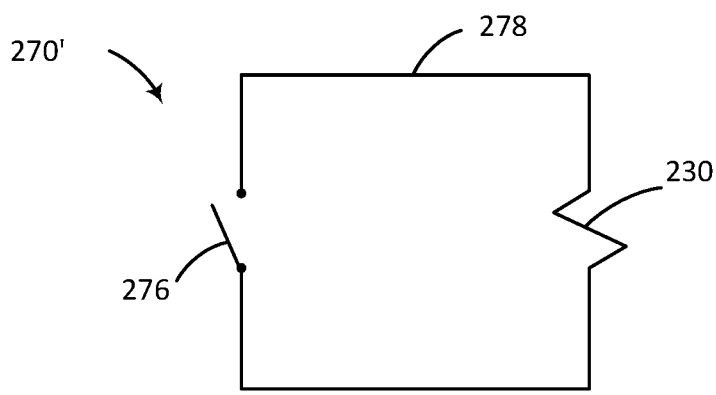
FIG. 4 is schematic diagram of another implementation of a control system of the laser device shown in FIG. 2.

In another implementation, as illustrated in FIG. 4, the control system 270' may include a relay 276 (which may also be referred to interchangeably herein as a switch) disposed in a relay circuit 278 and configured to energize and de-energize the shutter 228 (e.g., the solenoid 230 or other mechanism) to selectively block and allow the laser beam B to pass. The laser beam B may be blocked by the shutter 228 in response to the pressure reaching the threshold pressure. The laser beam B may be allowed by the shutter 228 in response to the pressure dropping below the threshold pressure, or in response to the pressure dropping below the second threshold pressure that is different from the threshold pressure. Any suitable type of switch or relay may be employed. The relay 276 may be separate from or integrated with the sensor 260. If integrated, the combined relay 276 and sensor 260 may be referred to as a vacuum switch. Other means for moving the shutter 228 are possible.

Figure 5:
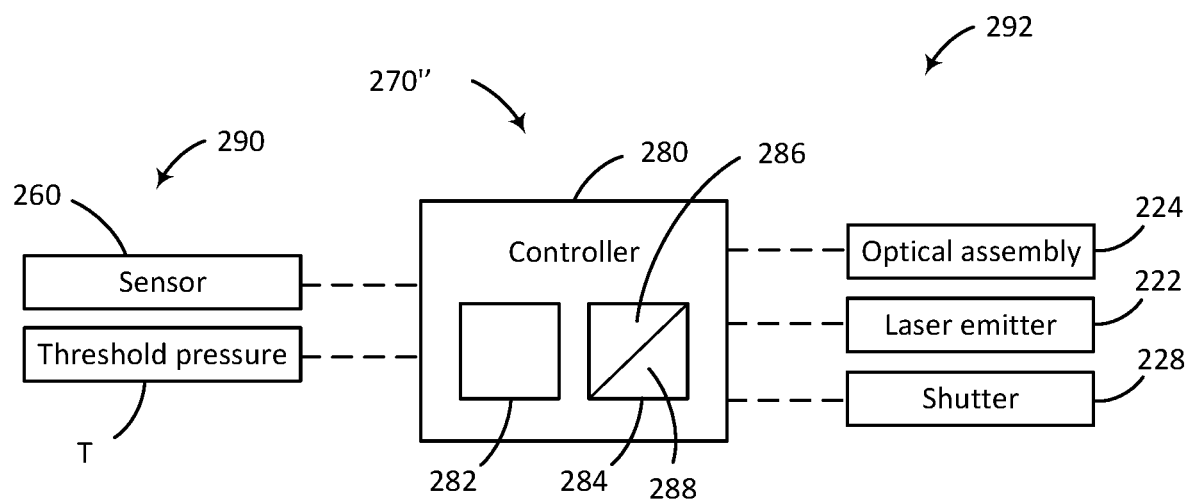
FIG. 5 is schematic diagram of yet another implementation of a control system of the laser device shown in FIG. 2.

In other implementations, as illustrated in FIG. 5, the control system 270" may employ a controller 280 configured to perform the same functions as (i.e., produce the same results as) the relay circuits 274, 278 described above. The controller 280 may be part of the laser device 210 or be part of the microscope M. When part of the laser device 210, the controller 280 may be integrated with a laser device controller having additional computer readable instructions for the laser device 210 or may be separate and dedicated to the vacuum interlock 258 (i.e., separate from the laser device controller). When part of the microscope M, the controller 280 may be integrated with a microscope controller having additional computer readable instructions for the microscope M or may be separate and dedicated to the vacuum interlock 258 (i.e., separate from the microscope controller).

As one example, the controller 280 may be configured to automatically control the laser emitter 222 and/or the shutter 228 (and/or other suitable means for changing the state of the laser beam B) as described above in response to the pressure associated with the vacuum chamber 107. The controller 280 may include a programmable processor 282 (e.g., a microprocessor, a microcontroller, or another suitable programmable device) and a memory 284 such as a non-transitory memory. The memory 284 may include, for example, a program storage area 286 and a data storage area 288. The program storage area 286 and the data storage area 288 can include combinations of different types of memory, such as read-only memory ("ROM"), random access memory ("RAM") (e.g., dynamic RAM ["DRAM"], synchronous DRAM ["SDRAM"], etc.), electrically erasable programmable read-only memory ("EEPROM"), flash memory, a hard disk, an SD card, or other suitable magnetic, optical, physical, electronic memory devices, or other data structures. The control system 270" may also, or alternatively, include integrated circuits and/or analog devices, e.g., transistors, comparators, operational amplifiers, etc., to execute the functionality described above.

In some implementations, the controller 280 may include one or more inputs 290 and outputs 292 to and from various components, as illustrated in FIG. 5. The controller 280 may be configured to provide control signals to the outputs 292 and to receive data and/or signals (e.g., sensor data, user input signals, etc.) from the inputs 290. The one or more inputs 292 may include, but are not limited to, the sensor 260, the threshold pressure T, and may include other components or user setpoints. The one or more outputs 292 may include, but are not limited to, the laser emitter 222, the shutter 228, the optical assembly 224, etc., and may include other components. Thus, the controller 280 may be programmed to automatically control any of these components, such as the laser emitter 222 and/or the shutter 228 and/or the optical assembly 224, to change the state of the laser beam B in response to the pressure reading as described above. The controller 280 may be separate from or integrated with the sensor 260. If integrated, the combined controller 280 and sensor 260 may be referred to as a vacuum switch.

In another implementation, features of the control system 270, 270', 270" may be combined in any combination (e.g., one or more aspects of one or both of the relay circuits 274, 278 may be combined with one or more aspects of the controller 280).

In any implementation, the threshold pressure may be preselected or may be selectable during operation by way of a user input. The control system implementations disclosed herein may be combined in any combination.

In some implementations, a redundancy may be added to the vacuum interlock 258. For example, the vacuum interlock 258 may include two of the vacuum interlock 258 described above, in any combination thereof. In some implementations, a redundant sensor 260 may be employed.

Figure 6:
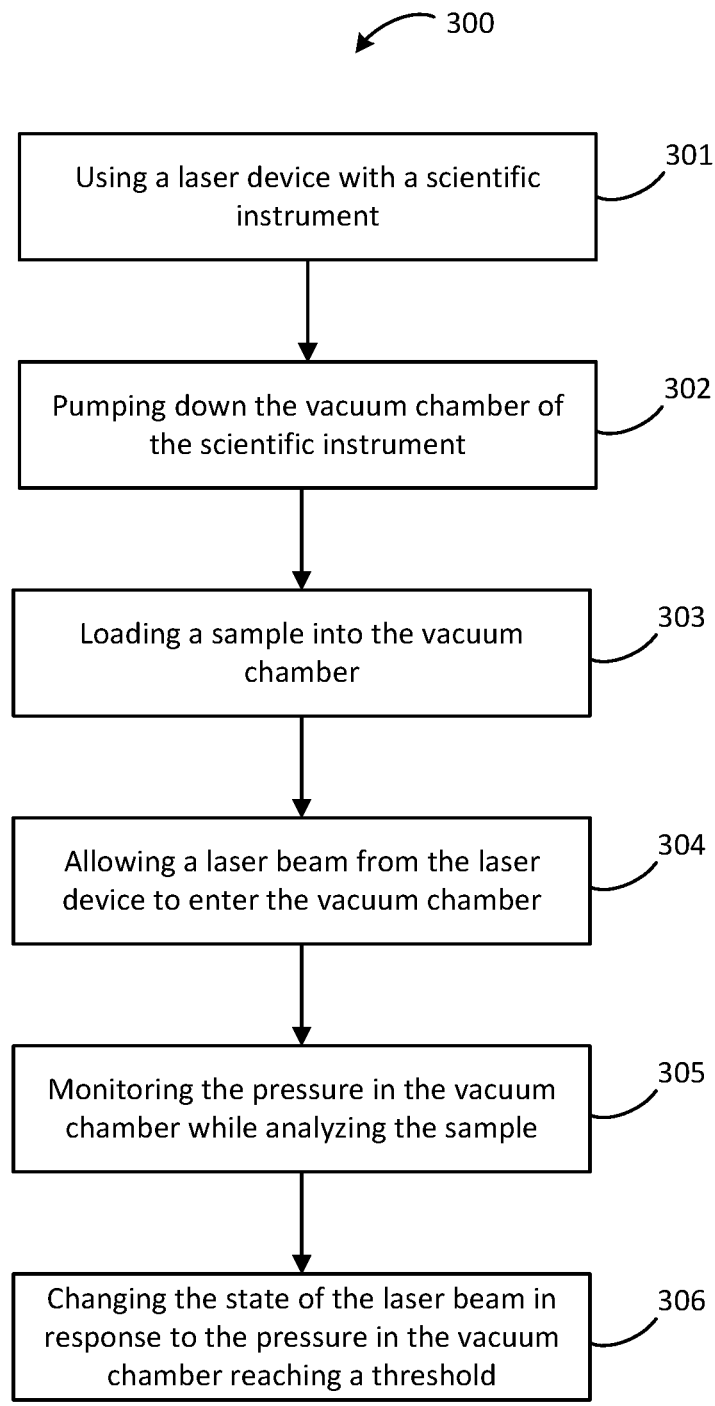
FIG. 6 is a method flow chart in accordance with the present disclosure.

FIG. 6 illustrates a method 300 of providing the vacuum interlock (or safety interlock) 258. The method may include steps 301-306, amongst other additional and intermediary steps apparent from the disclosure. At step 301, the method 300 includes using a laser device (such as the laser device 210) with a scientific instrument (such as the microscope M). Step 301 may include attaching the laser device 210 to the scientific instrument or using the laser device 210 integrated with the scientific instrument. The laser device 210 provides the laser emitter 222 configured to generate the laser beam B for radiating the sample S disposed in the vacuum chamber 107 of the scientific instrument. The sensor 260 configured to sense a pressure associated with the vacuum chamber 107 of the scientific instrument is also provided, either by the laser device 210 or by the scientific instrument. The laser device 210 may be removably attachable to the scientific instrument by way of the vacuum flange 246. At step 302, the method 300 includes pumping down the vacuum chamber 107 of the scientific instrument to create a vacuum condition for analyzing the sample S. For example, the pump 103 may be employed at step 302. At step 303, the method 300 includes loading the sample S into the vacuum chamber 107. For example, the specimen stage 108 may be employed at step 303. At step 304, the method 300 includes allowing the laser beam B to enter the vacuum chamber 107. For example, the relay circuit 274, 278 defaults to closing the circuit to allow the laser beam B at step 304. In some implementations, opening the circuit 278 may allow the laser beam B (e.g., by controlling the solenoid 230 to open the shutter 228). In other examples, at step 304, the controller 280 defaults to allowing the laser beam B to enter the vacuum chamber 107 unless the threshold pressure T is reached or exceeded. At step 305, the method 300 includes monitoring the pressure in the vacuum chamber 107 while analyzing the sample S. Monitoring may be performed by the control system 270, 270', 270" or by any other suitable means, and may include automatically monitoring using the same. At step 306, the method 300 includes changing the state of the laser beam B in response to the pressure in the vacuum chamber 107 reaching/exceeding the threshold level T, e.g., as read by the sensor 260. Changing the state of the laser beam B may include inhibiting the laser beam B when the pressure reaches the threshold level T. Inhibiting the laser beam B may include shutting off power to the laser emitter 222 and/or blocking the laser beam B with a shutter 228 or other opaque laser-blocking material having any suitable mechanical configuration. Blocking the laser beam with the shutter 228 may also include redirecting the laser beam B towards the shutter 228 (including any opaque material) using a mirror(s) or galvanometer(s). In such implementations, the shutter 228 may be embodied as an opaque portion of any part of the laser device 210 or the microscope M, such as a housing or enclosure thereof.

Further method steps, subsequent or intermediary, in the method 100 may be apparent from the following description of operation. In operation, when the laser device 210 is attached to the microscope M, the relay lens 232 and the objective lens 234 may be passed through the vacuum port 105 and disposed in the vacuum chamber 107 with the objective lens 234 being disposed near the sample stage 108. When attached, the vacuum extends from the vacuum chamber 107, through the vacuum port 105, and around the objective lens 234 and relay lens 232 as illustrated in FIG. 2. The vacuum is sealed at the vacuum sealing window 254. The pressure anywhere in this region is associated with the pressure in the vacuum chamber 107. The vacuum interlock 258 may be operable based on the reading of the pressure anywhere in this region. As long as the vacuum is held at a suitable pressure (at or below the first or second threshold pressure), the vacuum interlock 258 allows the laser device 210 to operate normally, e.g., such that the laser beam B may exit the laser device 210. If the pressure rises at or above the threshold pressure T (e.g., if the vacuum is broken), then the vacuum interlock 258 changes the state of the laser beam B (e.g., turns the laser emitter off, blocks the laser beam, etc.). The vacuum may be broken if a port on the microscope M is opened. The vacuum interlock 258 may also inhibit the laser beam B from exiting the laser device 210 when the laser device 210 is detached from the vacuum enclosure 106.

In some implementations, the vacuum interlock 258 only operates based on the pressure in the vacuum chamber 107. Thus, there is no need to employ sensors to monitor the individual status (open or closed) of various ports (such as the vacuum port 105 and others not shown) on the vacuum enclosure 106. If any port is opened to cause the vacuum in the vacuum chamber 107 to be broken, or if the vacuum is lost for any other reason, the single pressure sensor 260 detects the loss of vacuum. It should be understood that a "single" pressure sensor 260 may include redundancies (e.g., one or more backup pressure sensors 260 configured to perform the same function in the event of primary sensor failure).

Thus, the disclosure provides, among other things, a laser device 210 having a vacuum interlock 258. Various features and advantages of the disclosure are set forth in the following claims.

What is claimed is:

1. A laser device for use with a scientific instrument, the laser device comprising:
  a laser emitter configured to generate a laser beam for radiating a sample disposed in a vacuum chamber of the scientific instrument; and
  a control system configured to receive a pressure signal associated with the vacuum chamber from a pressure sensor, and to change a state of the laser beam in response to the pressure reaching a threshold level,
  wherein the scientific instrument is a charged particle microscope.

2. The laser device of claim 1, wherein changing the state of the laser beam includes shutting off a power to the laser emitter.

3. The laser device of claim 1, wherein changing the state of the laser beam includes blocking the laser beam.

4. The laser device of claim 1, wherein the threshold level corresponds to a pressure level higher than a normal operating pressure range of the vacuum chamber.

5. The laser device of claim 1, wherein the control system includes at least one of a relay or a programmable processor.

6. The laser device of claim 1, further comprising a vacuum flange configured to be removably attachable to the scientific instrument.

7. The laser device of claim 6, wherein the sensor is coupled to the vacuum flange.

8. The laser device of claim 1, further comprising an optical assembly configured to direct light reflected off the sample to a spectrograph.

9. A Raman probe for use with a microscope, the Raman probe comprising:
  a laser emitter configured to generate a laser beam for radiating a sample disposed in a sample chamber;
  a sensor configured to sense a pressure associated with the sample chamber;
  an optical assembly configured to direct light reflected off the sample to a spectrograph; and
  a control system configured to: monitor the pressure associated with the sample chamber;
  and change a state of the laser beam in response to the pressure reaching a threshold level.

10. The Raman probe of claim 9, wherein the optical assembly includes a spectrograph fiber configured to transmit the light reflected off the sample.

11. The Raman probe of claim 9, wherein the spectrograph includes:
  a filter configured to remove a laser beam wavelength from the light reflected off the sample, and
  a spectrograph detector configured to receive the filtered light from the filter.

12. The Raman probe of claim 9, wherein changing the state of the laser beam includes shutting off a power to the laser emitter.

13. The Raman probe of claim 9, wherein changing the state of the laser beam includes blocking the laser beam.

14. The Raman probe of claim 9, wherein the threshold level corresponds to a pressure level higher than a normal operating pressure range for the sample chamber.

15. The Raman probe of claim 9, wherein the control system includes a relay.

16. The Raman probe of claim 9, wherein the control system includes a programmable processor.

17. The Raman probe of claim 9, further comprising a vacuum flange configured to mount to the microscope, wherein the sensor is coupled to the vacuum flange.

18. A method of providing a safety interlock for a laser device useable with a scientific instrument, the method comprising:
  providing a laser emitter configured to generate a laser beam for radiating a sample disposed in a vacuum chamber of the scientific instrument;
  providing a sensor configured to sense a pressure associated with the vacuum chamber of the scientific instrument; and
  pumping down the vacuum chamber to create a vacuum condition for analyzing the sample;
  loading the sample into the vacuum chamber;
  allowing the laser beam to enter the vacuum chamber;
  monitoring the pressure while analyzing the sample; and
  changing a state of the laser beam in response to the pressure in the vacuum chamber of the scientific instrument reaching a threshold level;
  wherein changing the state of the laser beam includes inhibiting the laser beam.

* * * * *